United States Patent [19]
Roos

[11] Patent Number: 5,151,703
[45] Date of Patent: Sep. 29, 1992

[54] METHOD AND APPARATUS FOR IMPROVED AUTOMATIC FEQUENCY CONTROL

[75] Inventor: Mark G. Roos, Shawnee, Kans.

[73] Assignee: Allied-Signal Inc., Morris Township, Morris County, N.J.

[21] Appl. No.: 804,280

[22] Filed: Dec. 6, 1991

[51] Int. Cl.$^5$ .............................................. G01S 7/03
[52] U.S. Cl. ..................................... 342/199; 342/174
[58] Field of Search ............................... 342/174, 199

[56] References Cited

U.S. PATENT DOCUMENTS

| | | | |
|---|---|---|---|
| 3,611,380 | 10/1971 | Carlsson | 342/199 |
| 3,938,148 | 2/1976 | Hobson | 343/7 A |
| 3,950,751 | 4/1976 | Orr et al. | 343/18 E |
| 3,983,555 | 9/1976 | Morrison et al. | 342/199 |
| 4,071,844 | 1/1978 | Hopwood et al. | 343/17.2 R |
| 4,228,434 | 10/1980 | Williamson et al. | 343/5 AF |
| 4,240,076 | 12/1980 | Williamson | 343/7 PL |
| 4,484,193 | 11/1984 | Bellew | 343/5 SA |
| 4,600,924 | 7/1986 | Lobsinger et al. | 342/199 |
| 4,907,000 | 3/1990 | Tabourier | 342/84 |

*Primary Examiner*—T. H. Tubbesing
*Attorney, Agent, or Firm*—Christopher N. Malvone; Howard G. Massung; Robert A. Walsh

[57] ABSTRACT

The frequency of a variable frequency oscillator in a pulsed radar is adjusted using samples of an IF signal. An initial frequency adjustment is made using a sample taken during RF transmission. This initial adjustment contains an inaccuracy introduced by the magnetron's activity. An additional adjustment is made using temperature dependent values stored in a memory. Yet another adjustment is made during the radar's receive time using signals reflected by targets.

10 Claims, 1 Drawing Sheet

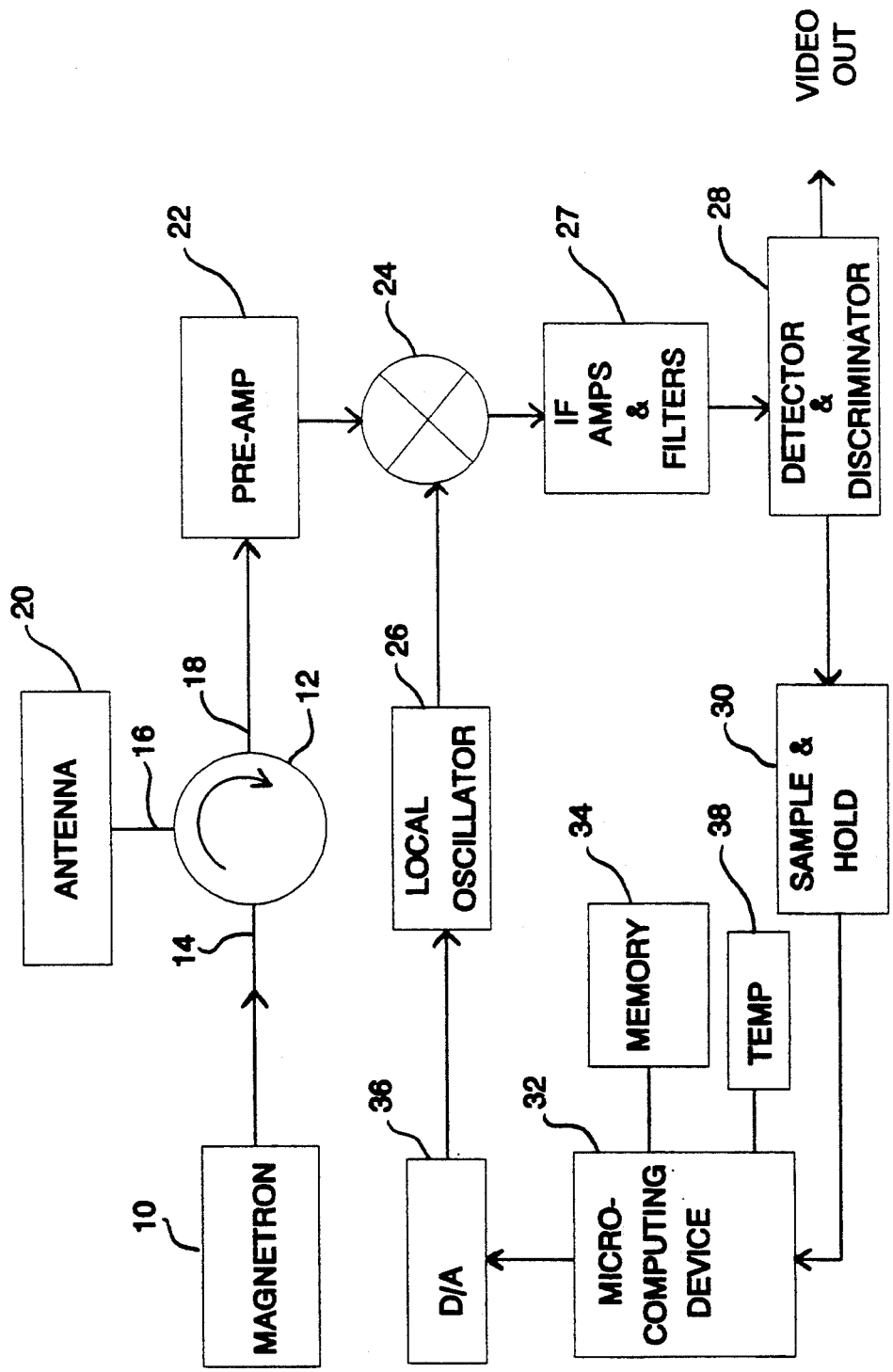

METHOD AND APPARATUS FOR IMPROVED AUTOMATIC FEQUENCY CONTROL

BACKGROUND OF THE INVENTION

1. Field of the Invention

In general, the present invention applies to radar systems. More specifically it relates to the automatic frequency control (AFC) of a variable frequency oscillator within a radar system.

2. Description of the Related Art

A radar system transmits and receives radio frequency (RF) energy. This high frequency energy is difficult to filter and amplify. To facilitate filtering and amplification, the RF echoes from targets are converted to an intermediate frequency (IF) at which filtering and amplification can be more readily accomplished. Conversion is accomplished by mixing the RF signal with a signal obtained from a variable frequency oscillator.

The IF filters and amplifiers have a limited bandwidth. If the oscillator's frequency drifts too much, the IF signal begins to drift outside of the bandwidth of the IF filters and amplifiers, and thereby degrades the radar's performance.

In the past, AFC was used to minimize the frequency drift of the oscillator. This was accomplished by sampling the frequency of the IF signal to verify that it was in middle of the IF bandwidth. If the IF signal began to drift outside of this bandwidth, the frequency of the oscillator was modified to make a correction. In the past, the IF signal was sampled during the RF transmission of the radar's magnetron.

When the magnetron fires, a large amount of energy is transmitted from the antenna into the atmosphere. Ideally all this energy is passed into the atmosphere, however, some energy leaks into the receiver. The leakage energy is mixed with a signal from the oscillator to produce an IF signal that is sampled to adjust the oscillator's frequency. If too much energy leaks into the receiver, there is a temporary shift in the frequency of the oscillator. This shift lasts for the duration of the RF transmission, and results in the oscillator operating at one frequency during RF transmission, and at another frequency during the radar's receive time. Since the IF frequency sample is taken during RF transmission, it includes the temporary shift in the oscillator's frequency. By adjusting the oscillator's frequency based on this inaccurate intermediate frequency sample, the performance of the radar is degraded.

In the past, this problem was addressed by providing as much isolation as possible between the magnetron and oscillator. Unfortunately, this isolation is expensive, takes up a great deal of space, and has a performance that degrades as temperature decreases.

SUMMARY OF THE INVENTION

The present invention automatically controls the frequency of a variable frequency oscillator by obtaining a first error voltage that indicates the frequency difference between a desired intermediate frequency and an actual intermediate frequency. The first error voltage is obtained by sampling the intermediate frequency during the transmission of a RF pulse. Based on the value of this error voltage, a control signal to a variable frequency oscillator is modified so that the actual intermediate frequency approaches the desired intermediate frequency. During the radar's receive time, a second error voltage is sampled where the error voltage indicates the frequency difference between a desired intermediate frequency and a second actual intermediate frequency. Based on this second error voltage, the control signal to the variable frequency oscillator is modified again so that the second actual intermediate frequency approaches the desired intermediate frequency.

The present invention solves the aforementioned problems by making an initial adjustment to the oscillator's frequency using a sample of the intermediate frequency that is taken during RF pulse transmission. The invention then uses reflections or echoes from nearby targets to obtain IF samples that are not corrupted by the magnetron induced oscillator frequency shift. Since this sample is taken at a time when the magnetron is inactive, the additional isolation that was used in the past is no longer necessary. Minimizing the amount of isolation reduces costs and saves space while maintaining the radar's performance.

DESCRIPTION OF THE DRAWINGS

The FIGURE is a block diagram of a radar system and illustrates the present invention.

DESCRIPTION OF THE PREFERRED EMBODIMENTS

The Figure illustrates the present invention. The RF energy from magnetron 10 is fed to circulator 12. Circulator 12 has ports 14, 16 and 18. Energy that enters port 14 is transferred to port 16, and energy that enters port 16 is transferred to port 18. The magnetron's RF energy enters port 14 and exits port 16. The RF energy from port 16 is transferred to antenna 20 and then transmitted into the atmosphere. Antenna 20 receives RF signals that are reflected by targets. The received signals are fed into circulator 12 through port 16. The signals from port 16 exit port 18 into pre-amplifier 22. Pre-amplifier 22 performs an initial amplification of the RF signals. The RF signals from pre-amplifier 22 are fed to mixer 24 where they are mixed with a signal from variable frequency oscillator 26. The output of mixer 24 is an IF signal having a frequency equal to the difference between the RF signal's frequency and the oscillator's frequency. The output of mixer 24 is fed to IF amplifiers and filters 27. At this point, the IF signals are amplified and band pass filtered to remove noise. The output of IF amplifiers and filters 27 is passed to detector and discriminator 28. The detector provides a video signal that is used by the rest of the radar system. The discriminator produces a DC error voltage that is dependent on the frequency difference between a desired intermediate frequency and the intermediate frequency received from IF amplifiers and filters 27. The desired intermediate frequency can be any frequency that is convenient for use with the components contained in IF amplifiers and filters 27, but it is preferable to use an intermediate frequency of 60 MHz. The DC signal produced by the discriminator, can range from negative to positive voltages, but is preferable to have the signal vary between 0 and 12 volts. In the preferred embodiment, a DC amplitude of 6 volts results when the actual intermediate frequency is equal to the desired intermediate frequency. If the actual intermediate frequency is below the desired frequency, the DC voltage is between 0 and 6 volts, and if the actual intermediate frequency is above the desired frequency, the DC signal is between 6 volts and 12 volts. The output of detector and discriminator 28 is received by sample and hold circuit 30. Sample and hold circuit 30 latches the output of detector and discriminator 28 so that the information can be made available to microcomputing device 32. Sample and hold circuit 30 converts the DC signal to a digital signal. This conversion takes place using a plurality of comparators that receive the DC signal on one input and a reference voltage on another input. It is also possible to use an analog to digital converter (A/D) to perform this function. Since the conversion time in this application is relatively fast, a flash converter A/D should be used. Since a flash converter A/D is expensive, it is preferable to use the comparators and reference voltages. Microcomputing device 32 uses the digital signal received from sample and hold circuit 30 to produce a control signal which modifies the frequency of oscillator 26. Microcomputing device 32 may be a microcomputer, a microcontrollor, or a microprocessor; it is preferable to use a microprocessor. Microcomputing device 32 also has access to memory 34. Memory 34 stores values that are used by microcomputing device 32 in producing the control signal for oscillator 26. Memory 34 can be a RAM, a ROM, an EEPROM, a UVPROM or any other type of nonvolatile memory. It is preferable to use a ROM. If oscillator 26 is equipped with a digital input, the control signal produced by microcomputing device 32 can be fed directly to the frequency control input of the oscillator. If oscillator 26 does not have a digital input, the control signal is fed to digital to analog converter 36. Digital to analog converter converts the control signal into an analog control signal which is connected to the frequency control input of oscillator 26.

When magnetron 10 produces a pulse of RF energy, the energy is fed into port 14 of circulator 12. The RF energy then passes through port 16 and out to antenna 20. Theoretically, all of the energy from port 14 passes through port 16 and none is transmitted to port 18. In actual practice, however, some of the energy from port 14 is passed to port 18. This leakage RF energy or signal passes through pre-amplifier 22 and into mixer 24 where the RF signal is mixed with a signal from oscillator 26 to produce an IF signal. After passing through IF amplifiers and filters 27, the frequency difference between this IF signal and the desired intermediate frequency is measured by the discriminator, and a DC output signal is produced. This signal is then sampled and converted to a digital value by sample and hold circuit 30. Microcomputing device 32 uses the digital value to produce a control signal that modifies the frequency of oscillator 26 in an attempt to make the actual intermediate frequency equal to the desired intermediate frequency.

The control signal that results from the intermediate frequency sample taken while magnetron 10 is active, is used to provide an initial adjustment to the frequency of oscillator 26. This is only an initial adjustment because this frequency sample includes an error which resulted from a magnetron induced frequency shift in oscillator 26.

In a preferred embodiment, a modification is made to the initial adjustment of oscillator 26 using the ambient temperature of the radar receiver. Since the isolation between magnetron 10 and oscillator 26 is dependent on temperature, the magnetron induced frequency shift of oscillator 26 is also dependent on temperature. By experimentally determining the amount of shift produced at different temperatures, a collection of frequency correction values is obtained. Memory 34 is used to store these temperature dependent values. By measuring the ambient temperature with temperature measuring device 31 and then retrieving the proper value from memory 34, microcomputing device 32 compensates for the frequency shift introduced into oscillator 26 by magnetron 10. The number of values stored in memory unit 34 can be any convenient number, but it is preferable to provide values that cover the entire operating range of the radar in 5° C. increments.

During the receive time of the radar, another adjustment is made to oscillator 26. During the receive time of the radar, magnetron 10 is inactive and does not induce a frequency shift in oscillator 26. The intermediate frequency that is sampled to make this adjustment is obtained using echoes which are received from targets within the radar's range. For a radar that has a transmit power of 3000 watts, it is preferable to use targets that are within 40 nautical miles of the radar. An intermediate frequency sample taken during the radar's receive time permits a more accurate determination of the difference between the actual intermediate frequency and the desired intermediate frequency. Using this more accurate measurement, microcomputing device 32 produces a control signal which further adjusts the frequency of oscillator 26.

The IF signal sampled during the radar's receive time may contain a doppler frequency shift induced by the motion of a target. In applications where target speed is relatively low, for example 100 miles/hr, the inaccuracy in the intermediate frequency measurement is insignificant with respect to the bandwidth of the IF amplifiers and filters.

I claim:

1. A method for providing automatic frequency control of a variable frequency oscillator in a pulsed radar, comprising the steps of:
   (a) sampling a first error voltage which indicates a frequency difference between a desired intermediate frequency and an actual intermediate frequency, said sampling occurring during a transmission of an RF pulse;
   (b) modifying a control signal to the variable frequency oscillator so that said actual intermediate frequency approaches said desired intermediate frequency;
   (c) sampling a second error voltage which indicates a second frequency difference between a desired intermediate frequency and a second actual intermediate frequency, said sampling occurring during a receive time of the radar; and
   (d) modifying said control signal to the variable frequency oscillator so that said second actual intermediate frequency approaches said desired intermediate frequency.

2. The method of claim 1, further comprising the steps of measuring an ambient temperature and modifying said control signal based on said ambient temperature.

3. The method of claim 2, wherein said step of modifying said control signal based on said ambient temperature comprises reading a temperature dependent value from a nonvolatile memory.

4. A method for providing automatic frequency control of a variable frequency oscillator in a pulsed radar, comprising the steps of:
   (a) sampling a first error voltage which indicates a frequency difference between a desired intermediate frequency and an actual intermediate frequency, said sampling occurring during a transmission of an RF pulse;

(b) modifying a control signal to the variable frequency oscillator so that said actual intermediate frequency approaches said desired intermediate frequency;

(c) measuring an ambient temperature; and (d) modifying said control signal based on said ambient temperature.

5. The method of claim 4, wherein said step of modifying said control signal based on said ambient temperature comprises reading a temperature dependent value from a nonvolatile memory.

6. An apparatus for providing automatic frequency control of a variable frequency oscillator in a pulsed radar, comprising:

(a) discriminator means for producing a DC signal having an amplitude which indicates the frequency difference between an actual intermediate frequency and a desired intermediate frequency;

(b) sample and hold means for sampling said DC signal to produce a digital signal in response to said DC signal, said DC signal being sampled during an RF pulse transmission and during a receive time; and (c) microcomputing means for producing a control signal that modifies a frequency of the variable frequency local oscillator, said control signal being produced using said digital signal.

7. The apparatus of claim 6, wherein said sample and hold means comprises an analog to digital converter.

8. The apparatus of claim 6, wherein said sample and hold means comprises a comparator means for comparing said amplitude of said DC signal to a plurality of reference voltages.

9. The apparatus of claim 6, further comprising a memory that stores a temperature dependent value used by said microcomputing means to produce said control signal.

10. The apparatus of claim 9, wherein said sample and hold means comprises a comparator means for comparing said amplitude of said DC signal to a plurality of reference voltages.

* * * * *